(12) United States Patent
Hertgens et al.

(10) Patent No.: US 9,099,508 B2
(45) Date of Patent: Aug. 4, 2015

(54) METHOD FOR AUTOMATIC MEASUREMENT AND FOR TEACHING-IN OF LOCATION POSITIONS OF OBJECTS WITHIN A SUBSTRATE PROCESSING SYSTEM BY MEANS OF SENSOR CARRIERS AND ASSOCIATED SENSOR CARRIER

(75) Inventors: Andreas Hertgens, Korschenbroich (DE); Torsten Mueller, Kerken (DE); Paul Waltner, Meerbusch (DE)

(73) Assignee: AES MOTOMATION GMBH, Meerbusch (DE)

( * ) Notice: Subject to any disclaimer, the term of this patent is extended or adjusted under 35 U.S.C. 154(b) by 672 days.

(21) Appl. No.: 13/256,382

(22) PCT Filed: Apr. 9, 2010

(86) PCT No.: PCT/EP2010/002213
§ 371 (c)(1),
(2), (4) Date: Sep. 20, 2011

(87) PCT Pub. No.: WO2010/115632
PCT Pub. Date: Oct. 14, 2010

(65) Prior Publication Data
US 2012/0022827 A1    Jan. 26, 2012

(30) Foreign Application Priority Data
Apr. 9, 2009  (DE) .......................... 10 2009 016 811

(51) Int. Cl.
*H01L 21/68* (2006.01)
*H01L 21/67* (2006.01)
(Continued)

(52) U.S. Cl.
CPC .... *H01L 21/67259* (2013.01); *H01L 21/67265* (2013.01); *H01L 21/681* (2013.01); *H01L 21/67778* (2013.01); *H01L 21/68707* (2013.01)

(58) Field of Classification Search
CPC ............ H01L 21/681; H01L 21/67259; H01L 21/67778; H01L 21/68707; H01L 21/67796; H01L 2223/54493
See application file for complete search history.

(56) References Cited

U.S. PATENT DOCUMENTS 4,521,966 A * 6/1985 Karlsson ........................ 33/1 M
5,981,966 A   11/1999 Honma
(Continued)

FOREIGN PATENT DOCUMENTS

JP         2005032913 B    2/2005

*Primary Examiner* — Timothy H Hwang
(74) *Attorney, Agent, or Firm* — Andrew Wilford

(57) ABSTRACT

The invention relates to a method for automatic measurement and for teaching-in of location positions of objects (11) within a substrate processing system (20, 26) in which a sensor carrier (1) is moved by means of a robot end effector (24). Sensor units (2, 3, 4, 5a, 5b) of the sensor carrier (1) are moved along straight movement lines (B1, B2, B3) across the edges (10a, 10b) of the object (11), wherein each of the sensor units (2, 3, 4, 5a, 5b) output at least one sensor signal which changes its value upon detection of an edge (10a, 10b). From the positions of the signal changes along the respective straight movement lines (B1, B2, B3), the location position of the object (11) is determined. Furthermore, the invention relates to a substrate like movable, wireless sensor carrier for carrying out the method according to the invention, with a carrier plate (1a), at least one first sensor unit (4, 5a, 5b) which is mounted on the carrier plate (1a) and which is arranged to detect a first object edge (10a) and a second object edge (10b) of the object (11) during a movement of the sensor carrier (1) on a straight movement line (B1) perpendicular to an object surface (13), and at least one second sensor unit (2, 3) which is mounted on the carrier plate (Ia) and which is arranged to detect at least a first object edge (10b) of the object (11) during a movement of the sensor carrier (1) on a straight movement line (B2) parallel to the object surface (13).

18 Claims, 9 Drawing Sheets

(51) Int. Cl.
*H01L 21/677* (2006.01)
*H01L 21/687* (2006.01)

(56) References Cited

U.S. PATENT DOCUMENTS

| | | | |
|---|---|---|---|
| 6,327,512 B1* | 12/2001 | Hirata et al. | 700/114 |
| 7,456,977 B2 | 11/2008 | Ramsey | |
| 7,493,231 B2* | 2/2009 | Graf | 702/151 |
| 7,572,742 B2 | 8/2009 | Hiroki | |
| 7,706,919 B2 | 4/2010 | Adachi | |
| 2002/0068992 A1* | 6/2002 | Hine et al. | 700/229 |
| 2003/0205905 A1* | 11/2003 | Chen et al. | 294/1.1 |
| 2005/0034288 A1* | 2/2005 | Adachi et al. | 29/25.01 |
| 2005/0265814 A1* | 12/2005 | Coady | 414/744.5 |
| 2006/0245871 A1* | 11/2006 | Lo et al. | 414/416.03 |
| 2009/0196717 A1* | 8/2009 | Holden | 414/222.02 |
| 2011/0176637 A1 | 7/2011 | Hu et al. | |

* cited by examiner

METHOD FOR AUTOMATIC MEASUREMENT AND FOR TEACHING-IN OF LOCATION POSITIONS OF OBJECTS WITHIN A SUBSTRATE PROCESSING SYSTEM BY MEANS OF SENSOR CARRIERS AND ASSOCIATED SENSOR CARRIER

CROSS REFERENCE TO RELATED APPLICATIONS

This application is the US-national stage of PCT application PCT/EP2010/002213 filed 9 Apr. 2010, published 14 Oct. 2010 as WO2010/115632, and claiming the priority of German patent application 102009016811.7 itself filed 9 Apr. 2009.

FIELD OF THE INVENTION

The present invention relates to a method for automatic measurement and for recording of location positions of objects in a substrate processing system in which a sensor carrier is moved by means of a robot grab. Furthermore, the invention relates to such a movable sensor carrier for carrying out this method, wherein the sensor carrier is designed wireless and has a carrier plate, the shape and dimensions of which substantially correspond to the ones of a substrate object to be processed.

BACKGROUND OF THE INVENTION

Systems for processing of substrates such as, for example, semiconductor wafers or photovoltaic wafers, glass substrates for photovoltaic products, FPD (Flat Panel Display) products or CCD (Charge-Coupled Device) products or reticles comprise in most cases a plurality of system component stations to which or from which the substrates are transported by means of a robot. System component stations are, for example, storage containers for substrates, also called cassettes, or stations for manufacturing processes such as etching, vaporization, coating, rinsing, drying, exposing, cleaning, heat treatment, etc. Also, in the processing system, transfer points can be present which require depositing the substrate and picking it up again. For this purpose, means for supporting the substrate are provided, such as gripper arms, support columns, support pins, transfer pins, clamping or suction means which are necessary for the handling of the substrates and which come into mechanical contact with the same.

Due to the high sensitivity of the substrates, in particular with respect to a mechanical damage and surface contamination, and due to the high material value of the substrate, high precision robot systems are used for movement and for the transport of the substrates, and the handling itself is carried out exclusively under clean environmental conditions. To avoid chemical reactions of the substrate, in particular of oxidation processes, it is further known to perform, to some extent, the loading and unloading of processing stations from or into cassettes filled with substrates in an inert atmosphere. For this purpose, the chamber in which the processing station or a transfer station, the substrate container, and the robot are arranged is filled with an inert gas, for example with a noble gas or nitrogen.

The robot system for the transport of the substrates has to carry out precise movements and has to ensure the gripping, transporting, and depositing of substrates with high reliability. To prevent mechanical damage to the substrate surface, an exact positioning, aligning and parallelizing of the substrate relative to the devices in the processing systems is necessary. For gripping a substrate, its location or position in space must be known exactly to avoid the danger of unintended scratching of the substrate surface or also of another component of the substrate processing system. The latter could result in that material particles are scraped off from a mechanically damaged component of the substrate processing system and pollute or contaminate the substrate surface or another device of the substrate processing system. Further, a precise aligning of the substrate is important so that the substrate does not slide during the transport. If this is the case, the substrate could slide against another component, for example an arm or a holding member, and the surface could get scratched. A damage to the substrate results in its uselessness.

For a reliable, precise gripping, positioning, and depositing of the substrates in the substrate processing system, the knowledge of their exact position or of the spatial position of the pick-up and depositing positions of suitable means such as, for example, cassettes or suction or clamping means of a processing station is an essential prerequisite. Even fractions of a millimeter can result in an incorrect gripping, positioning, or depositing of the substrate and can cause damage.

It is known to specify the location position of the individual substrates at first manually or to take it over from drawing data, in particular CAD drawings. However, a specified substrate position must be maintained at all times which is rarely ensured in practice. Further, through wear of the moving parts in the processing system, the tolerances become gradually larger. This leads to the situation that the gripper grab of the robot does not grip the substrate accurately any more. Further, maintenance, repair work, modifications or new arrangements of processing stations require a new recording of the substrate positions for the access of the robot grab, which can result in high down times, and in case of a local intervention in contamination of the latter.

It is further known to perform the recording of the substrate positions in an automated manner. For this, substrate-like sensor carriers are used, i.e., sensor carriers which have the shape of the substrates to be transported and/or to be processed. This has the advantage that the sensor carrier can be treated in the processing environment like a normal substrate. Sensor carriers of this type have a height of less than the vertical spacing of two substrates in a cassette and have the dimensions of the planar substrates, in case of wafers to be processed, for example, a diameter of 150 mm, 200 mm, or 300 mm. Such sensor carriers can be stored in a conventional substrate storage container and can be used as required by the robot system for measuring the substrate positions. The manual intervention of a technician in the substrate processing system can hence be avoided.

Such a substrate-like sensor carrier is known, for example, from WO 03067183 A2. This sensor carrier uses an optical camera, by means of which a picture is taken of a target object, or of a substrate, respectively, the position of which is to be measured. Based on this picture, the location position in space of the substrate is calculated. The disadvantage of this system is that reference points must be available on the substrate object to be measured, which reference points must subsequently be looked for in the taken picture. Another disadvantage of this method is that an optical camera and a suitable image evaluation system is needed, which results in increased cost of the sensor carrier and in a high complexity of the same. Finally, it is also a disadvantage that the substrate object to be imaged must always be illuminated to allow an evaluation of the taken picture.

OBJECT OF THE INVENTION

Thus, it is the object of the present invention to provide a sensor carrier and a method for automatic measurement and for recording of location positions of planar substrate objects, which method can be produced in a constructively simple and hence cost-effective manner, and which does not need auxiliary means.

SUMMARY OF THE INVENTION

This object is solved by means of a wireless sensor carrier for automatic measurement and for recording of location positions of objects in a substrate processing system is proposed, comprising a carrier plate, the shape and dimensions of which correspond substantially to the ones of a substrate to be processed, wherein on the carrier plate at least one first sensor unit is mounted which is set to detect a first object edge and a second object edge of the object during a movement of the sensor carrier on a straight movement line perpendicular to the object surface, and wherein on the carrier plate at least a second sensor unit is mounted which is set to detect at least a first object edge of the object during a movement of the sensor carrier on a straight movement line parallel to the object surface, wherein from each of the sensor units, sensor signals can be output which show signal changes upon reaching an object edge.

Such a sensor carrier allows the automated acquisition of location positions of any object in the processing system with technically simple and cost-effective means by detection of the edges of an object. An object within the meaning of the invention can be a substrate, in particular a semiconductor wafer or photovoltaic wafer, a glass substrate for photovoltaic, FPD (Flat Panel Display) or CCD (Charge-Coupled Device) products, or a reticle, or a pick-up means and/or depositing means, or a mechanical component of a processing station for such a substrate connected thereto which has measurable edges. An automatic recording of handling positions in unloading units and loading units of the processing system is hence implementable.

At first, the sensor signals can be sent wireless to a process unit of the processing system or to a robot control which carries out the calculation of the location position of the object. Alternatively, the edge information captured by the sensor carrier can be evaluated directly on the sensor carrier and the location position can be calculated which then can be sent wireless to a process unit or control unit of the processing system for controlling the robot grab, where it can be stored for further use.

The sensor carrier is designed in the shape of a substrate to be processed so that it can be moved, on the one hand, like a normal substrate through the processing environment and, on the other hand, can be stored or deposited in a normal substrate container, and can be picked-up from there as needed to perform an new recording of the substrate positions. Special additional fixtures or holding members on the robot grab or on a processing station, or other auxiliary means, for example reference points attached in the vicinity of a substrate object, are not necessary.

By means of the sensor carrier, the location positions of all objects in the processing system can be determined within a shorter time as it would be the case for a manual recording. Hereby, the installation time is shortened and the down time of the substrate processing systems is reduced. The automated recording of the location position avoids mistakes which can happen during the manual specification of the positions.

The first sensor unit of the sensor carrier can comprise at least one sensor which is mounted on the carrier plate in such a manner that its detection range is aligned substantially parallel to an object surface. A parallel alignment of the detection range allows the recognition of end-face edges of the object. From these edges, the center of the object in the direction of its thickness can be determined.

In an advantageous development of the sensor carrier, the first sensor unit comprises two or more sensors which are mounted on the carrier plate in such a manner that their detection ranges are aligned substantially parallel to the object surface. By using two sensors, which together form a sensor unit, inclines of the edges, i.e., an alignment of the object which is not perpendicular to the moving direction of the sensor carrier relative to the object can be recognized. For this purpose, the sensors can be arranged spaced apart from one another on the carrier plate and can be arranged symmetrically with respect to the moving direction of the sensor carrier. A detection of the incline is possible in that one of the sensors meets an edge earlier than the other sensor. By evaluation of the sensor signal, the incline of the edge in space can be determined.

According to the invention, also the second sensor unit can comprise at least one sensor. The same can be mounted on the carrier plate in such a manner that the detection range is oriented substantially perpendicular to the object surface. A perpendicular alignment of the detection range allows the recognition of the edges bordering the surface of the object. By means of these edges, the center of the substrate in the direction of its width can be determined in case of rectangular substrates and the center of the substrate in the direction of the diameter can be determined in case of round substrates. This direction is designated hereinafter as x-direction of a Cartesian coordinate system.

In an advantageous development of the sensor carrier, the second sensor unit comprises two or more sensors which are mounted on the carrier plate in such a manner that their detection ranges are oriented substantially perpendicular to the object surface. By means of two sensors, the number of movements required for the determination of the center of a contour can be reduced in case of a round substrate and the length of the movement can be reduced in case of angular substrates.

The sensor or the sensors can preferably be optical reflection sensors. The same consist of a light-emitting element and a light-sensitive element arranged next to it. If an edge is reached, at this edge, a reflection of the emitted light takes place which is captured by the light-sensitive detector. Then, the usually digital output signal of the sensor changes its value. A signal edge is generated that can be evaluated.

For the measurement according to the invention of the objects it is necessary to move sensors across their edges. For the measurement of objects with curved edges it is advantageous when the carrier plate, which is round in this case, has an edge-side recess into which the object can be moved. This allows moving the sensors close to the object for measuring the same in z-direction if the object lies in a horizontal position. Hereinafter, the one axis of a Cartesian coordinate axis is designated as z-direction which is arranged vertically in space. The recess can be symmetrically with respect to the diameter.

It is particularly advantageous when the sensor units are arranged in the sensor carrier's front region oriented towards the object, in particular at the border of the carrier plate. This ensures that sensors detect the edges even if a safety-related spacing between the sensor carrier and the object is maintained. In terms of the recess, this has the advantage that the sensor carrier does not have to be moved close to the object at a distance that the object projects far into the recess. Also, the movement lengths can be reduced by an arrangement of the sensors in the sensor carrier's front region oriented towards the object.

A particularly simple implementation of the first sensor unit is achieved in that it is designed as a light barrier, the transmitting and receiving units of which are mounted on the side wings laterally bordering the recess in such a manner that the beam of the light barrier runs parallel to the recess. If the sensor carrier is moved in z-direction past the front face of the object in such a manner that the object projects into the recess, an interruption of the light barrier takes place, and as a result of that, the center of the object in z-direction can be determined. Preferably, the transmitting and receiving units of the light barrier are arranged at the front end of the side wings. This too ensures that the sensor carrier can be guided along the object at a sufficient safety clearance and that its edges can be reliably recognized.

In a particularly advantageous development of the sensor carrier according to the invention, the carrier plate has an opening for each sensor of the second sensor unit towards the respective sensor is oriented in such a manner that its detection range extends through the opening. Thereby is avoided that the sensor or the sensors of the second sensor unit project(s) beyond its peripheral border or borders. This could have the disadvantage that the sensors could be damaged during the transport of the sensor carrier. The opening or openings, respectively, allow that the sensor/sensors must not project beyond the border of the sensor carrier. This in turn offers the advantage that the sensor carrier can be stored for transport or storage purposes in a cassette.

Furthermore, according to the invention, a method for automatic measurement and for recording of location positions of objects in a substrate processing system is proposed in which a sensor carrier according to the invention is moved by means of a robot grab, wherein sensor units of the sensor carrier are moved across the edges of the object, the sensor units output at least one sensor signal which changes its value upon reaching an edge, and wherein by means of the positions of the signal changes along the respective straight movement line, the location position of the object is determined.

Through the measurement of the edges of an object, the position and also the incline in space of the object can be determined in the substrate processing system in a reliable and precise manner and without additional means. The method is reproducible and can be used at any time, in particular in intervals, for example to prevent mechanical damage to the objects due to a handling error caused by worn components.

According to the invention, the sensor carrier can be placed at first at a safety clearance before an object according to specified starting coordinates in space. Then, the center of a first contour and the center of a second contour as well as the spacing of the object to a reference point can be determined, and from these values, the location position, in particular the center of the object can be determined by addition of an offset and/or by known dimensions. As a first contour, for example, the outline of the object's front face oriented towards the sensor carrier can be used, which front face is straight for an angular object as well as for a round object. As second contour, the straight side edges of an angular object or the curved peripheral edge of a round or curved object can be used.

For determination of the center of a straight contour, at least one sensor can be moved along a straight movement line across the two edges defining the contour, wherein the sensor outputs a sensor signal which changes its value upon detection of an edge, and wherein the center of the contour is determined by calculating the arithmetical average of the positions of the signal changes along the straight movement line. Alternatively, two sensors can be used by means of which the center in the direction of the width of an angular substrate can be determined, with one sensor on the left side moving across the left edge of the contour and one sensor on the right side moving across the right edge of the contour. Here too, the center of the contour can be determined from the changes of the sensor signals by calculating the arithmetic average of the positions of the two signal changes along the straight movement line.

For measuring a straight contour of an object with contour edges which are not perpendicular to the moving direction of the sensor carrier or to the environment, the used sensor unit of the sensor carrier can have two sensors, each of them outputting a sensor signal which changes its value upon detection of an edge. The two sensors can then be moved at least across the first edge defining the straight contour, wherein the signal changes of the sensor signal generated by this edge are compared to one another with respect to their respective position along the straight movement line, and wherein, when there is a difference, a new straight movement line that is tilted by an angle with respect to the first straight movement line is employed.

Preferably, the evaluation of the signal change, the tilting of the straight movement line, and the movement of the sensor unit can be repeated in an iterative method until the position difference of the two signal changes along the last straight movement line lies below a specified threshold, wherein subsequently the determination of the center of the contour takes place.

Furthermore, for determination of the center of a curved contour, at least one sensor can be moved along a first straight movement line across the edge forming the curved contour, wherein the sensor can output a sensor signal which changes its value upon detection of the edge, and wherein subsequently the straight movement line can be displaced parallelly by a specified amount, and wherein the sensor can be moved along said second straight movement line across the edge, and wherein the center of the contour can be calculated from the positions of the signal changes along the two straight movement lines.

If the last straight movement line does not lie on the diameter of the object, the positions of the last and the penultimate signal change can be compared to one another prior to the calculation of the center of the contour by means of an iterative method, and from the position differences of these signal changes, a new straight movement line can be determined which is displaced parallelly with respect to the previous straight movement line, and the sensor can be moved again along said new straight movement line. The comparison of the last and the penultimate signal change, the calculation of a new straight movement line, and the movement along the new straight movement line is then repeated until the position difference of the two last signal changes along the respective straight movement line lies below a specified threshold. Then, the center of the contour is found since the last straight movement line lies on the diameter of the object.

The method can advantageously be developed further in that for the measurement of a curved contour, two sensors are used, each of them outputting a sensor signal which changes its value upon detection of an edge. The number of movements required for the determination of the center of the contour can thus be significantly reduced. The sensors can then be moved along a first straight movement line across the edge forming the curved contour, wherein from the positions of the two signal changes along the straight movement line, the center of the contour is calculated.

If the last straight movement line does not lie on the diameter of the object, the positions of the two last signal changes can be compared to one another prior to the calculation of the center of the contour by means of an iterative method, and from the position differences of these signal changes, a new straight movement line can be calculated which is displaced parallelly with respect to the previous straight movement line, and along which new straight movement line, the sensor can be moved again. This can take place with an iterative method, wherein the comparison of the signal changes of the two sensors, the calculation of a new straight movement line, and the movement along the new straight movement line is repeated until the position difference of the two signal changes along the last straight movement line lies below a specified threshold. Then, the center of the contour is found since the last straight movement line lies on the diameter of the object.

As reference point, preferably the starting coordinates are used. For determination of the spacing of the object to the starting coordinates, a sensor unit of the sensor carrier can be moved along a straight movement line towards the center of the second contour and across the edge bordering the surface of the object on the front face, wherein from the position of the signal change triggered by said edge and from the starting coordinates, the spacing can be determined.

After the determination of the location position, the sensor carrier can be deposited by the robot grab at a depositing position or can be placed before a further object, and the method according to the invention for determination of the same can be repeated.

In order that the location positions for controlling the handling robot are available, they can be saved in a storage unit of the sensor carrier, of the substrate processing system, and/or of a robot control.

The invention is described hereinafter by means of exemplary embodiments and the attached Figures in which purely exemplary a circular substrate is used as object. However, the invention can also be used for any other objects in the processing system which have measurable edges, in particular pick-up and depositing means of process stations for the substrates. Whenever technically appropriate, the features described for an embodiment variant can also be applied to another embodiment variant without departing from the fundamental idea of the invention. In the Figures, identical reference numbers designate identical or similar components.

SPECIFIC DESCRIPTION OF THE DRAWING

Figure 1:
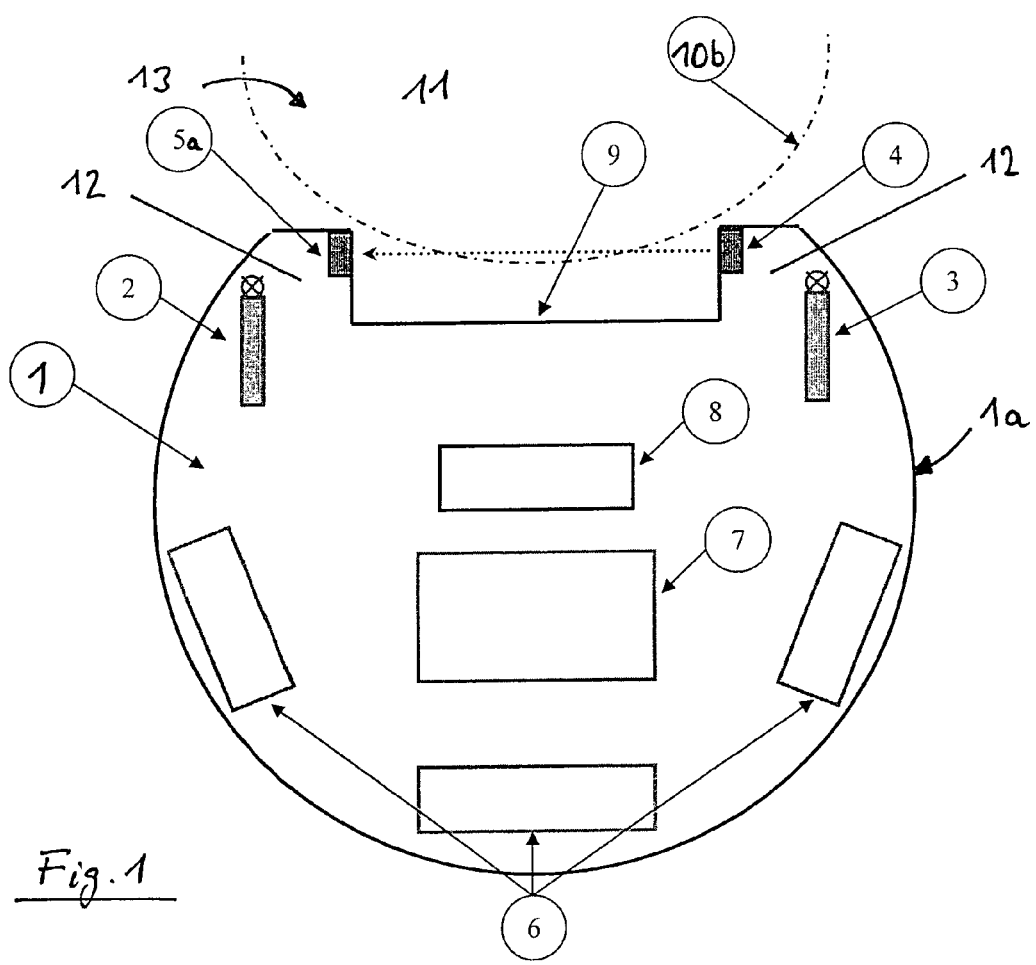
FIG. 1 shows a sensor carrier 1 in round shape with a recess and a light barrier

FIG. 1 shows a first exemplary embodiment variant of a sensor carrier 1 according to the invention. The sensor carrier 1 has a circular carrier plate Ia and is hence provided for the measurement of circular substrates 11 in a substrate processing system 20, 26. Shape and dimensions of the carrier plate Ia thus correspond substantially to the ones of the substrate object 11 to be measured. On the carrier plate Ia, a first sensor unit 4, 5*a* is mounted, by means of which a first object edge 10*a* and a second object edge 10*b* of the substrate object 11 can be detected during a movement of the sensor carrier 1 along a straight movement line B1 perpendicular to the substrate surface 13. This sensor unit 4, 5*a* is designed as light barrier and comprises a transmitter unit 4 and a receiver unit 5*a*.

Furthermore, the carrier plate 1*a* carries a second sensor unit comprising two reflection sensors 2 and 3 arranged symmetrically and spaced apart from one another. With the reflection sensors 2 and 3 of the second sensor unit, the edge 10*b* bordering the surface 13 of the substrate object 11 can be detected. Below each of the sensors 2 and 3, the carrier plate 1*a* has a non-shown opening. The sensors are aligned with these openings in such a manner that their detection ranges extend through these openings. In FIG. 1, this is symbolized by the crosses arranged in a circle. This means that the light emitted from the reflection sensor is emitted downwards and, in case of a reflection, is reflected at an edge or surface of the substrate object 11 to be measured and is captured through these openings by the light-sensitive element of the reflection sensor 2 and 3.

The sensor carrier has a peripheral recess 9 which, in this embodiment variant, is symmetrical with respect to the diameter and has a rectangular shape. Due to the recess 9, side wings 12 are generated on which the transmitter unit and receiver unit 4, 5*a* of the light barrier are arranged. Thus, the light barrier runs parallel to the recess 9. The side wings 12 are folded on the front face, i.e., towards the substrate object 11 so that in case of a movement in z-direction, the sensor carrier 1 can be brought closer to the substrate object 11. Thus it is ensured that the substrate object 11 can be moved far enough into the recess 9 during a movement of the sensor carrier 1 in z-direction and interrupts the light barrier. Transmitter unit 4 and receiver unit 5*a* are arranged on the side wings 12 on the periphery of the recess 9 and are arranged in the very front with respect to the substrate object 11 so that the substrate object 11 does not have to be inserted too far into the recess 9. Hereby, a sufficient safety clearance between the sensor carrier 1 and the substrate object 11 is maintained.

Furthermore, the sensor carrier 1 comprises components 6, 7, 8 for processing the sensor signals. An accumulator 8 is provided, the position of which on the sensor carrier 1 is arbitrary; however, with respect to a balanced weight distribution and with respect to the center of gravity, it should be arranged centered on the sensor carrier and symmetrically with regard to the further components. This applies also to the sensor electronics 6 which take over the processing of the sensor signals. To each sensor 2, 3, 4 (in case of a reflection sensor, FIG. 2), 5a, 5b, one sensor electronics, respectively, is assigned. A sensor signal processing 7 including a radio transmission module is also provided on the sensor carrier 1. With respect to a diameter of the sensor carrier 1 which corresponds to the moving direction of the sensor carrier relative to the substrate object 11, all components are arranged symmetrically on the carrier plate 1a.

If the plane substrate object 11 typically lies with its substrate surface 13 in a horizontal plane, the first sensor unit 4, 5a serves for measuring the substrate object in the vertical plane, and the sensors 2 and 3 of the second sensor unit serve for measuring the same in the horizontal plane.

Figure 2:
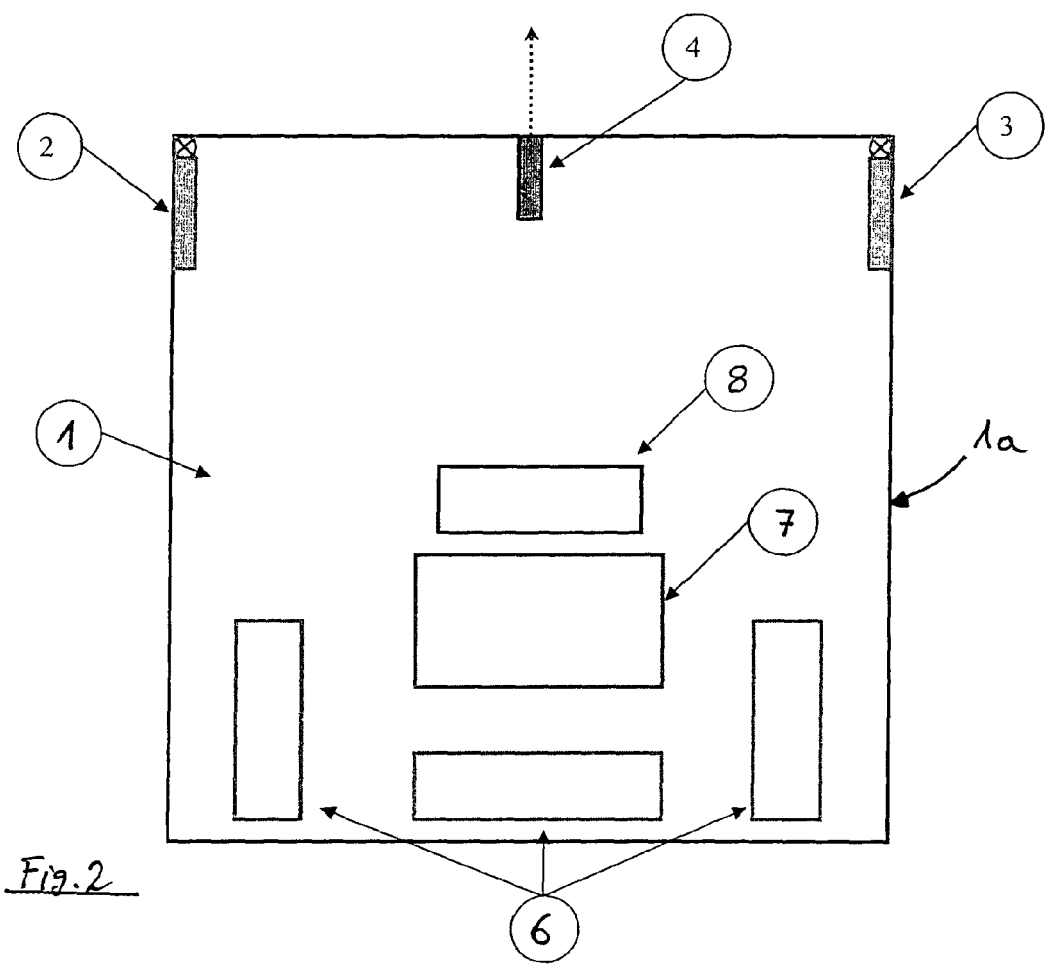
FIG. 2 shows a sensor carrier 1 in angular shape with a sensor 4 of the first sensor unit

FIG. 2 shows a second embodiment variant of a sensor carrier 1 according to the invention. In this embodiment, the carrier plate 1a is designed rectangular, and in particular square. Thus, the sensor carrier 1 can be used particularly advantageously in processing systems which move angular substrates. For this sensor carrier 1, the first sensor unit is formed by one single sensor 4, the detection range of which, in case of parallel alignment of the carrier plate 1a with the substrate surface 13, is also aligned parallel to the substrate object surface 13. Further, the detection range extends vertically away from the edge of the carrier plate 1a which is oriented towards the substrate object 11. The sensor 4 is also designed as reflection sensor and hence allows for the recognition of the front face 14 of the edges 10a, 10b bordering the substrate object 11.

The reflection sensors 2 and 3 of the second sensor unit are arranged in the very front of the carrier plate 1a which is oriented towards the substrate object 11. Here, the sensors 2 and 3 are located directly at the border of the carrier plate 1a in such a manner that the light-emitting and the light-sensitive units of the sensors are arranged in the corners of the carrier plate 1a. Thus, only a minimal movement across the substrate object 11 to be measured is necessary to detect its edges.

Figure 3:
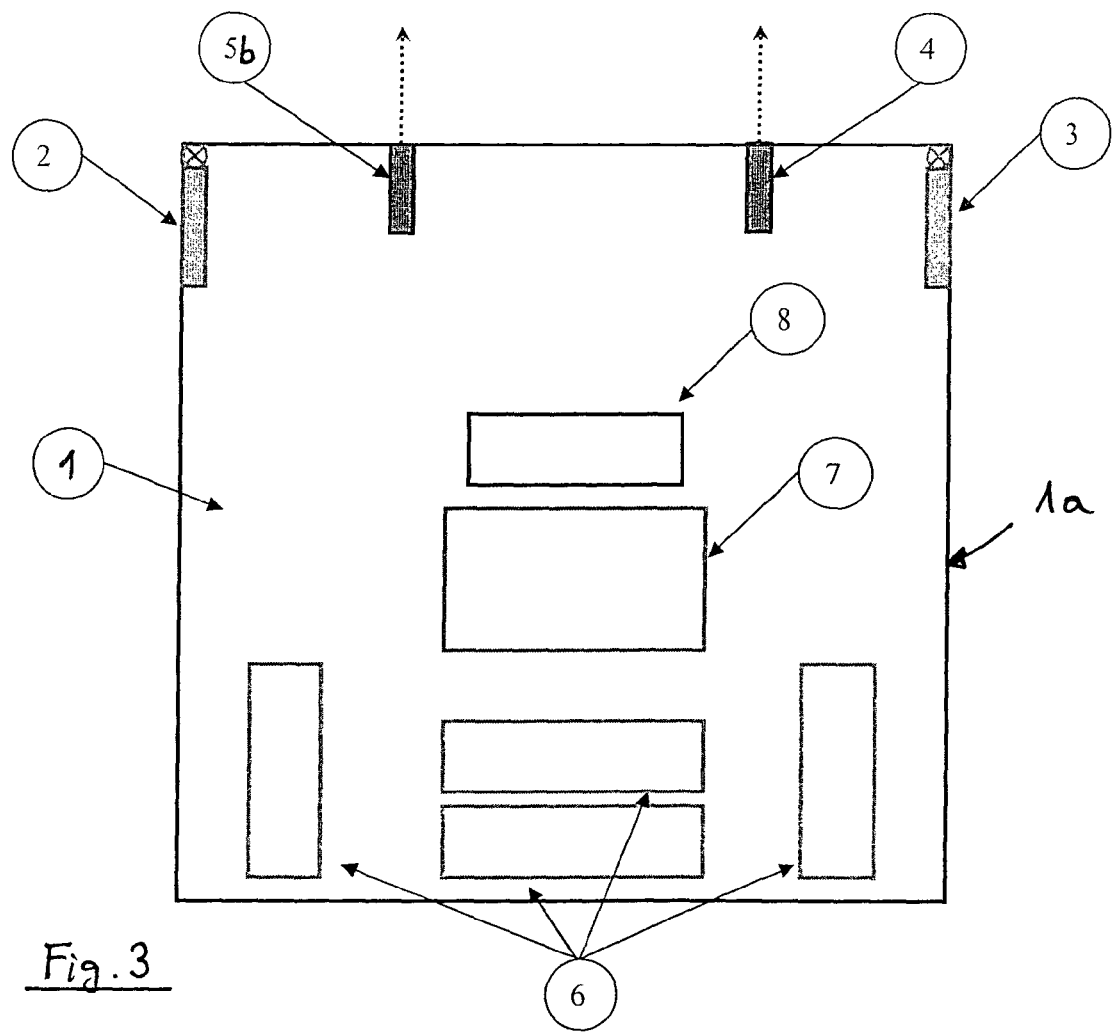
FIG. 3 shows a sensor carrier 1 in angular shape with two sensors 4, 5*b* of the first sensor unit

FIG. 3 shows an embodiment variant of a sensor carrier 1 which is further developed with respect to FIG. 2, wherein the first sensor unit comprises two sensors 4, 5b which are designed as reflection sensors. By means of these sensors, the case can be detected that a substrate object 11 to be measured is tilted in the horizontal plane. The two sensors 4, 5b are spaced apart from one another and are arranged symmetrically on the carrier plate 1a with respect to the moving direction of the sensor carrier 1 relative to the substrate object 11. The detection ranges of the sensors 4, 5b are also aligned parallelly and extend parallelly to the moving direction of the sensor carrier 1 relative to the substrate object 11. Thus, the sensors 4, 5b can also detect the edges 10a, 10b bordering the front face 14 of the substrate object 11, i.e., they can measure the substrate object 11 in the vertical plane. Apart from that, the sensor carrier according to FIG. 3 corresponds to the embodiment variant according to FIG. 2 and substantially to the embodiment variant according to FIG. 1, and comprises also one electronics 6 for each of the sensors 2, 3, 4, 5b, a sensor processing 7, and an accumulator 8.

With respect to the moving direction of the sensor carrier 1 relative to the substrate object 11 and parallel to the surface of the same, the components mounted on the carrier plate 1a are arranged symmetrically. Furthermore, they are all mounted on the same surface of the carrier plate 1a so that the sensor carrier 1 can be held on its bottom side by a robot grab 24 without a problem, and the bottom side of the carrier plate 1a can be moved coplanar over the surface 13 of the substrate object 11.

Figure 4:
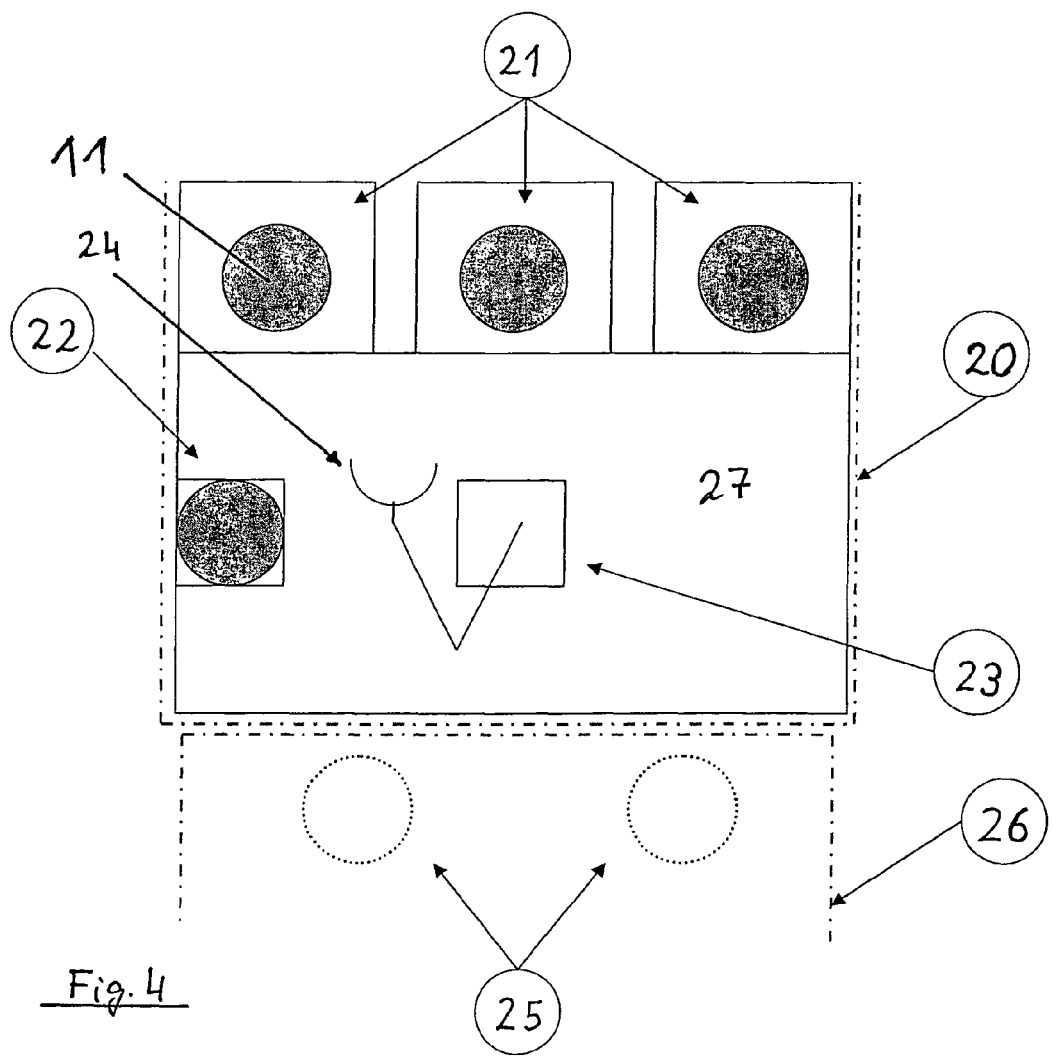
FIG. 4 shows a schematic illustration of a substrate processing system 20 with robot 23, pick-up and depositing stations 21, and processing stations 25

FIG. 4 shows a schematic illustration of a substrate processing system 20, 26. The substrate processing system consists of an unloading/loading unit 20 and a process machine 26. The loading/unloading unit 20 comprises a chamber 27 which can be filled, for example, with nitrogen and in which a robot 23 moves. The robot 23 has an grab 24, by means of which substrate objects 11 can be taken out of cassettes or storage containers 21 and can be introduced into the process machine 26. Non-illustrated transfer stations allow a transfer or placement of the substrate from chamber 27 into the process machine 26. The process machine can have customer-specific process stations 25 in which the substrate objects 11 are to be processed. Furthermore, a station 22 for substrate alignment can be provided in the chamber 27.

The use of a sensor carrier 1, the shape and dimensions of which correspond substantially to the ones of the substrate 11 to be processed has the advantage that no additional devices in the loading/unloading unit 20 or in the process machine 26 has to be provided to determine the location position of the individual substrate objects 11. Instead, the sensor carrier 1 can be stored like a normal substrate object 11 in a cassette 21 and can be gripped by the robot grab when needed, and the substrate objects 11 can then be measured. After that, the sensor carrier can be put back into the storage cassette 21. In particular, a continuous recording of changing positions due to wearing components such as support pins or moving parts can be performed.

A sensor carrier 1 according to the invention allows for collecting position information with respect to location and incline of a substrate object 11 in the substrate processing system 20, 26. The position information can be related in a relative manner to a reference point or can be related in an absolute manner to a defined origin of a coordinate system. By means of the radio transmission module 7, the sensor signals can be transmitted wireless to a process control which performs the evaluation of the signals. Alternatively, the evaluation can be carried out directly in an evaluation unit on the sensor carrier. Thus, the measurement of the location position of the substrate objects 11 can be performed without disturbing the operating sequence or without manual interruptions or interventions in the substrate handling.

Figure 5A:
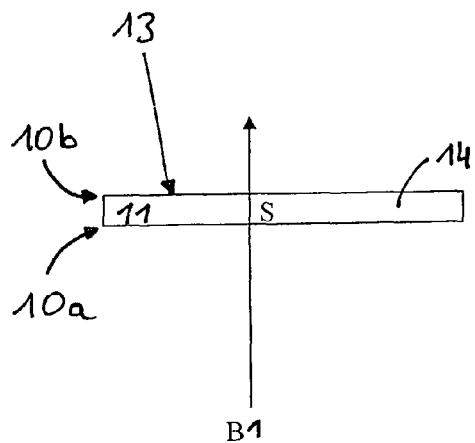
FIG. 5*a* shows a view of the front face 14 of an object 11 and the measurement of the front face 14 with one sensor

The sensors 2, 3, 4, 5a, 5b of the sensor units each deliver an output signal, the value of which changes upon detection of an edge 10a, 10b. Preferably, the signal outputs of the sensors 2, 3, 4, 5a, 5b are performed digitally so that in case of an edge detection, a signal change occurs. As soon as a transition from the free space to the substrate object 11 is passed by a sensor 2, 3, 4, 5a, 5b, the respective sensor delivers a signal edge at its output, which signal edge can be recognized by means of the sensor electronics 6 and can be evaluated. FIGS. 5a-5b show a graphical illustration of the movement sequences during edge detection.

FIG. 5a illustrates the measuring of the front-face contour of a substrate object by means of a sensor S along a straight movement line B1, i.e., of a contour defined by two straight edges 10a, 10b. Hereinafter, as contour, the outline or the contour line of a body is to be understood. The straight movement line B1 extends, for example, vertically, i.e. in z-direction. The sensor carrier 1 is moved according to this straight movement line B1 in vertical direction from bottom up along the front face 14 of the substrate object 11. In case of a round substrate, the light barrier 4, 5a according to FIG. 1 can be used as sensor unit for edge detection, and in case of an angular substrate 11, the reflection sensor 4 according to FIG. 2 can be used for edge detection. When the sensor 4, 5a reaches the lower edge 10a, its output signal changes its value. The signal output changes again when edge 10b is reached. The positions of the signal changes along the straight movement line B1 can be evaluated, wherein under ideal conditions, the calculation of the arithmetic average delivers the center of the contour of the front face in vertical direction.

FIG. 5b shows the measurement of the front face 14 by means of two sensors S, wherein the substrate object 11 is slightly tilted in the horizontal plane. This results in that the straight movement line B3 is not perpendicular to the substrate surface 13.

At first, the sensors are moved according to the straight movement line B3 across the edges 10a, 10b bordering the front face 14. Since now two sensors are used for detection, the movement of the sensor carrier 1 along a straight movement line results in that each sensor is moved on one straight movement line, respectively, wherein the straight movement lines are parallel to one another. When the two sensors are now moved along the lower edge 10a, the signal changes of the sensor signals occur at different positions along the straight movement line. This is an indication that the substrate object 11 is tilted. From the position difference of the two signal changes and by tilting the straight movement line, a straight movement line B4, which is perpendicular to the substrate surface 13, can be determined mathematically or iteratively. Along this straight movement line B4, the positions of the signal changes occur substantially simultaneously. By passing the lower and the upper edge 10a, 10b and by calculating the arithmetic average of the position changes along the straight movement line of a sensor, the vertical center of the front-face contour can then be determined.

Figure 5C:
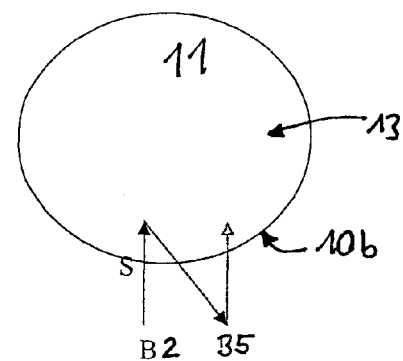
FIG. 5*c* shows a top view of the object 11 and the measurement of the curved contour with one sensor
Figure 5B:
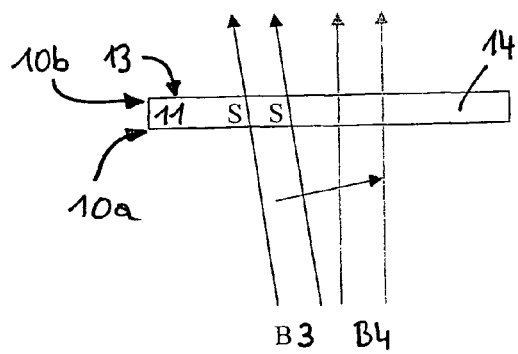
FIG. 5*b* shows a view of the front face 14 of an object 11 and the measurement of the front face 14 with two sensors

FIG. 5c shows the substrate object 11 in a top view. The curved edge 10b bordering the surface 13 represents at the same time the contour of the substrate object 11 in this view. FIG. 5c illustrates the movement across the edge 10b by means of a single sensor S in direction of the straight movement line B2, the parallel displacement of the straight movement line to a new straight movement line B5 with the sensor moving back at the same time to its home position, and once again, the movement across the edge 10b along the new straight movement line B5. Now, two space coordinates are known from the peripheral edge 10b of the substrate. Further, the radius of the same is assumed to be known.

From these known variables, the center of the substrate surface 13 can be calculated. As will be explained below, the center of the contour can also be determined by means of an iterative method.

Figure 5D:
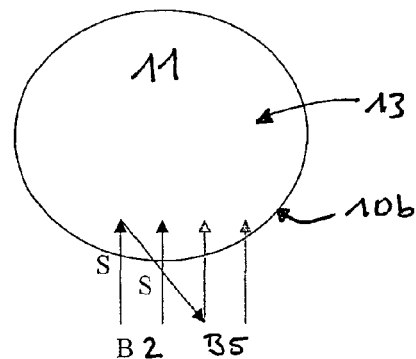
FIG. 5*d* shows a top view of the object 11 and the measurement of the curved contour with two sensors

FIG. 5d shows the measurement of the curved contour 10b by means of two sensors S. The advantage compared to the embodiment variant 5c with one sensor is that when traveling across the edge 10b, two coordinates can be detected at the same time so that the number of necessary movements can be reduced. From the fact that the positions of the two sensor signals along the respective straight movement line of a sensor do not occur at the same time can be concluded that the movement of the sensor carrier 1 along a straight movement line relative to the substrate object 11 does not lie on the diameter of the same. For determination of the center of the contour by means of an iterative method, the original straight movement line is thus displaced parallelly and the sensor carrier 1 is guided along this new straight movement line towards the substrate object 11. This is illustrated purely schematically in FIG. 5d. Preferably, the amount of the parallel displacement depends on the amount of the position difference, i.e., the greater the difference of the positions of the two signal changes with respect to the straight movement, the greater is the parallel displacement to be carried out in the next step. In FIG. 5d, the amount of the parallel displacement is increased with respect to the position difference of the sensor signals to illustrate the principle of the iterative method. The parallel displacement and the movement of the sensors along the displaced straight movement line are repeated until the position difference of the signal changes lies below a specified threshold. Then, the straight movement line of the sensor carrier 1 lies substantially on the center of the contour of the edge 10b, i.e. on a diameter of the substrate object 11.

Hereinafter, the process flow is explained in more detail by means of the FIGS. 6 to 9.

Since the method according to the invention concerns an automatic recording of location positions of the planar substrate objects 11, which are used in the subsequent control of the robot system, the method according to the invention can also be referred to as "auto-teach-function" (ATF).

In the method according to the invention, sensor units with sensors 2, 3, 4, 5a, 5b of the sensor carrier 1 are moved along straight movement lines B1, B2, and B3 across the edges 10a, 10b of a substrate object 11, wherein the sensor units each output at least one sensor signal which changes its value upon detection of an edge 10a, 10b, and wherein from the positions of the signal changes along the respective straight movement line B1, B2, B3, the location position of the substrate object 11 is determined.

Figure 6:
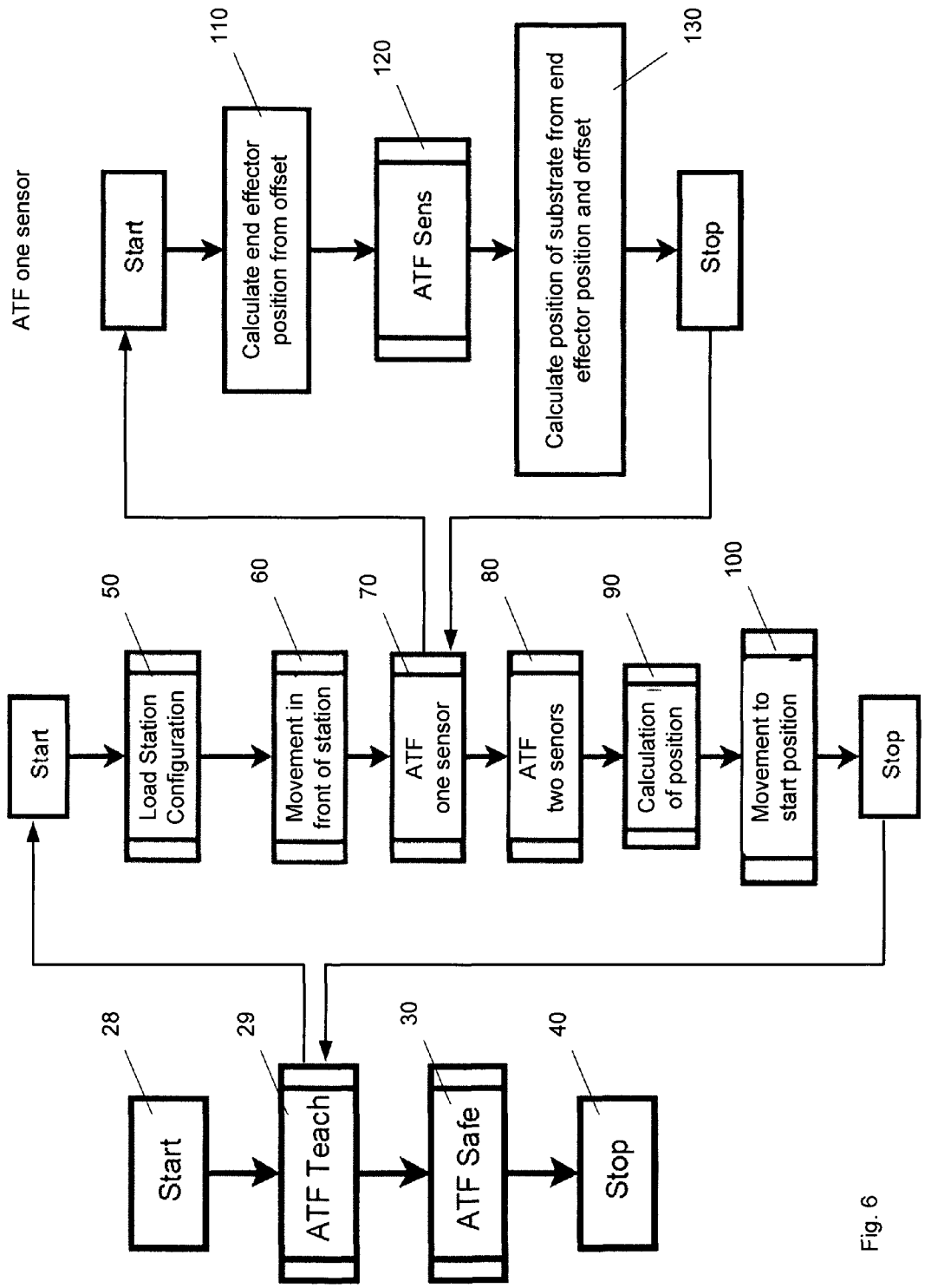
FIG. 6 shows a schematic illustration of the general process flow
Figure 7:
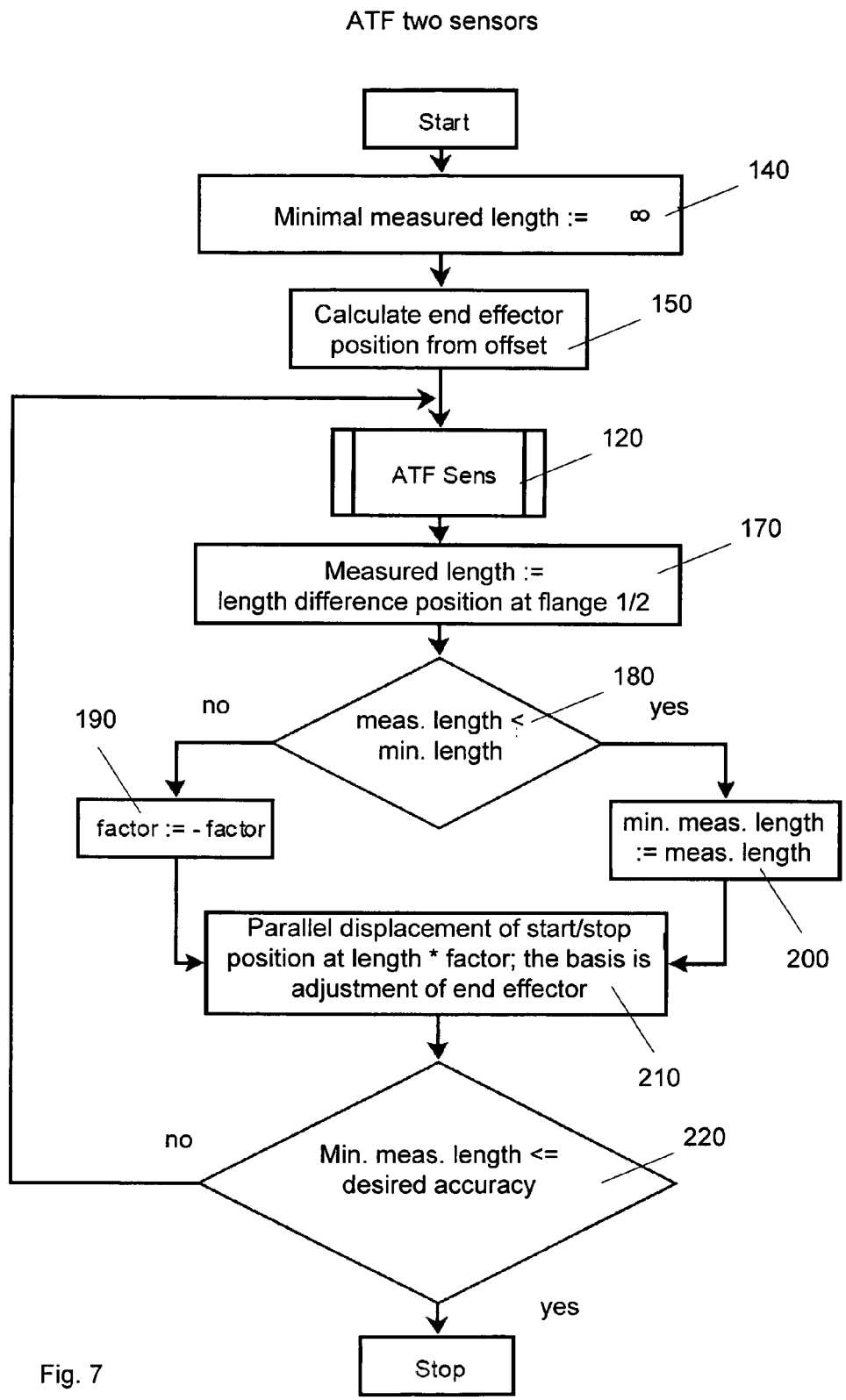
FIG. 7 shows a schematic illustration of the process flow during edge measurement with two sensors

According to FIG. 6, the method starts with the block 28 designated as "Start". In the following block 29, the process steps designated as "ATF Teach" are summarized, by means of which the location position in space of a substrate object 11 to be measured is determined, in particular, is calculated. The execution of the these process steps is followed by a storage of the location positions, block 30, so that the robot 23 can be controlled at a later time according to the determined location positions for gripping or depositing the substrate object 11 to be measured. After the storage of the position information, the process is completed, see block 40.

The process flow for measuring the substrate object 11 comprises the steps described below, compare FIG. 6.

First, the configuration data for the substrate processing system 20, 26 are loaded, block 50. Said configuration data comprise specific information about the substrate to be handled, in particular with respect to its thickness and its dimensions as well as its approximate position in space, in particular with respect to the position of the robot 23 or the coordinate origin.

The sensor carrier 1 is subsequently gripped by the robot grab 24 and is moved at a safety clearance in front of the one station of the substrate processing system in which a substrate 11 to be measured is located. Such a station can be, for example, a cassette 21 (see FIG. 4). The movement before the station is designated as block 60.

Subsequently, the vertical center of the substrate object 11 is determined. This takes place in the process section "ATF one sensor". In this section, at first the position of the robot grab 24 (End-effector Position) is calculated from an offset, see block 110. The offset arises from the spacing of the coordinates, according to which the robot grab 24 has initially been positioned before the station, to the origin of the selected coordinate system. This origin lies preferably in the geometrical center of the robot 23.

Figure 8:
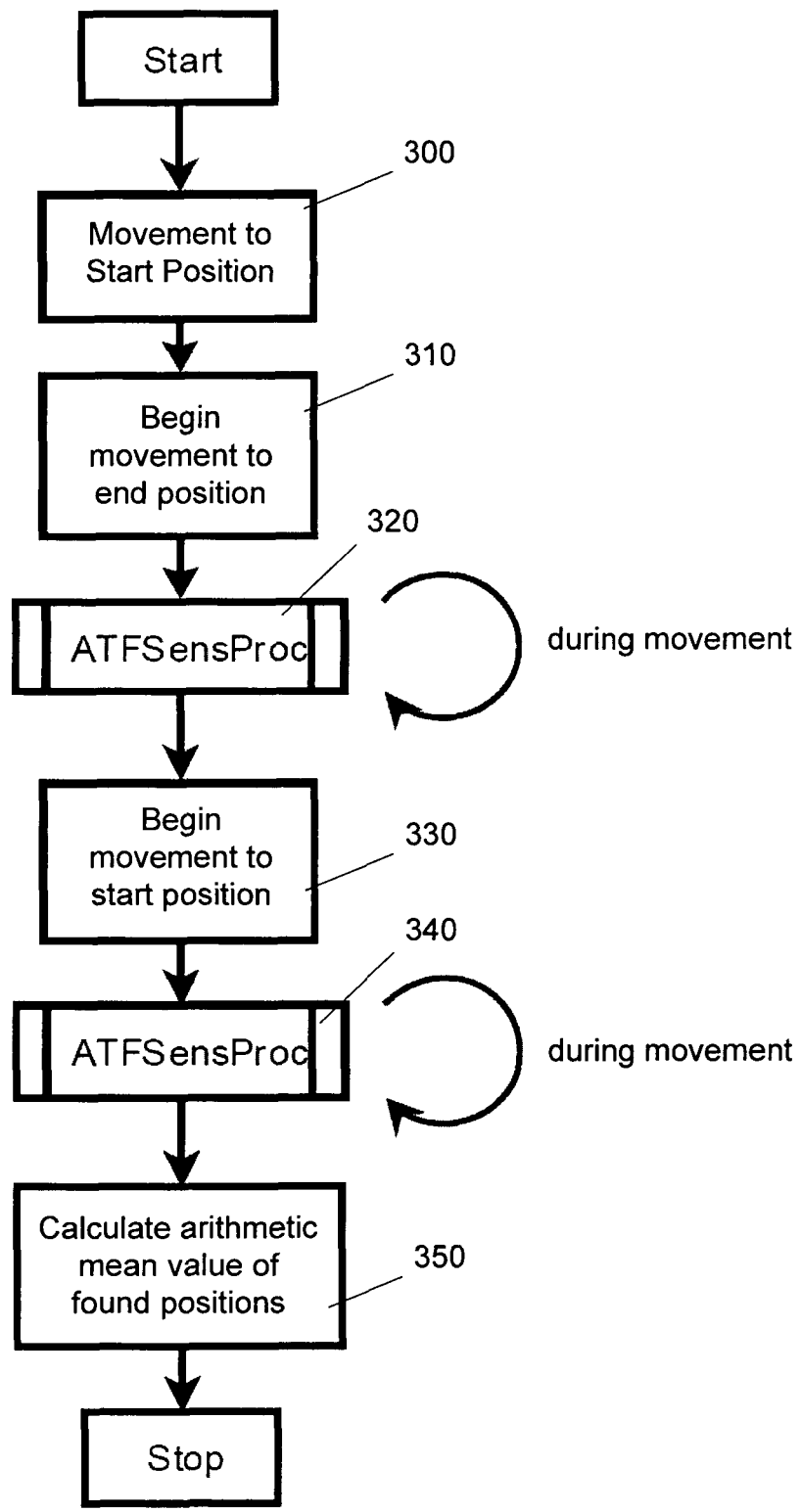
FIG. 8 shows a schematic illustration of the process steps during movement of the sensor over the object

In the next process step 120 "ATF Sense", the sensor carrier 1 is now moved across certain edges 10a, 10b. The sequence of these process steps is illustrated in FIG. 8. At first, the sensor carrier 1 is moved to a specified start position, see block 300.

Figure 9:
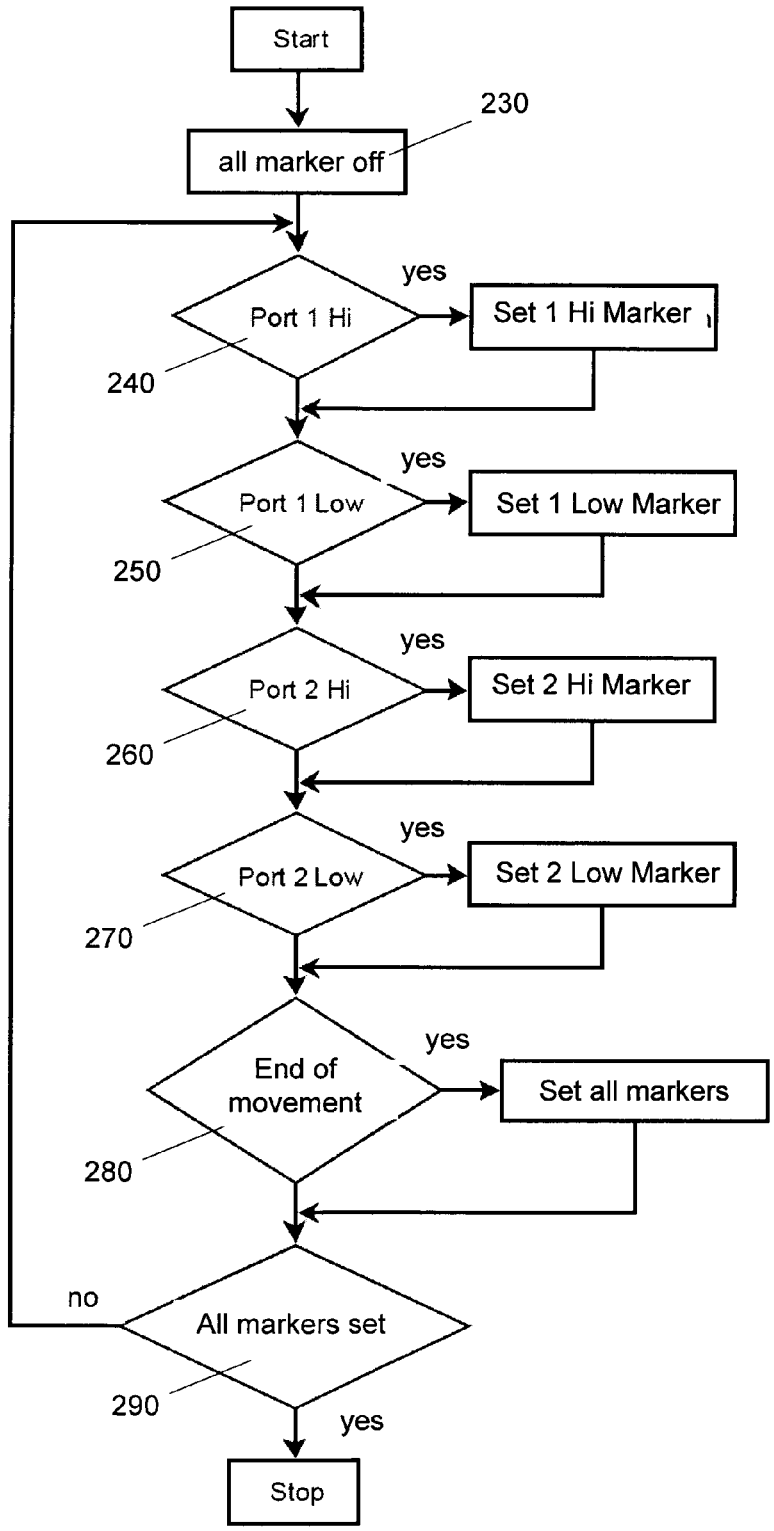
FIG. 9 shows a schematic illustration of the process flow for the edge recognition.

When the same is reached, the travel to an end position along a first specified straight movement line B1 (cf. FIG. 5a) begins, see block 310. Start position, end position, and the straight movement line resulting therefrom arise from the known approximate position of the substrate object in space. During this movement, process steps are carried out which are executed in block 320 "ATFSenseProg". These process steps are illustrated in FIG. 9.

In "ATFSenseProg" 320, at first, the so-called markers which mark the coordinates of the signal changes are deleted "all marker off", step 230. After that, the sensor signal of the sensor used for measuring the edges is monitored in a loop. The process flow illustrated in FIG. 9 shows a schematic illustration of a computer-implemented routine for carrying out the process steps. Upon its call, this routine is informed about the port "Port" to which the sensor signal to be monitored is sent, and an expected value for this sensor is passed to the routine. This allows a universal call of the routine 320 or the execution of the respective process steps independent of the fact which sensor unit or which sensors are used since to each sensor, a concrete port "Port" is assigned, which has to be checked in case of a concrete application.

When using a single sensor for determination of the center of the contour of the substrate object 11 in z-direction, it is sufficient that the routine "ATFSenseProg" checks only one port (Port 1). At this port, the occurrence of a rising or falling signal edge is expected. Based on the state that the sensor signal has a value "low" when the respective sensor is not above the substrate object 11, at first a "hi" is expected at the signal port. This is checked in step 240. If this is the case, a first edge is obviously reached and the position of the signal change along the straight movement line is noted in coordinates under the marker "Set 1 hi Marker". If this is not the case at the time of the inquiry, the check follows if the port "Port 1" has the value "low", see step 250, wherein this takes place in consideration of the expected value. When the signal is indeed "low", but a "hi" is expected, no marker is set.

If no further sensor for edge detection is used, inquiring further ports is not necessary, i.e. the steps 260, 270 are eliminated. Now, in step 280, the check takes place if the movement is completed, i.e. end of movement is reached. If this is not the case, another check follows to see if all markers are set. Since for the measurement of the front-face contour of the substrate object, the detection of a further edge 10b is necessary and the movement is not completed yet, the setting of the marker for the second edge 10b is still missing. Therefore, the process continues the checking of the port for "hi" and "low" in consideration of the expected value, which is periodically repeated in a loop. When the second edge 10b is reached, the routine detects in block 250 that the sensor signal has changed to the expected "low", and the position of the sensor change is stored in the marker "Set 1 low Marker". Since now all markers are set, the routine is completed according to the case differentiation performed in block 290.

Now, the travel to the starting position follows, see block 330 in FIG. 8. This means that the sensor carrier is moved along the straight movement line in opposing directions so that the contour can be measured one more time on the way back. This serves for the purpose to compensate for the hysteresis which occurs in sensors. Due to this hysteresis it can happen that the switching threshold of a sensor does not react exactly upon reaching the edge, i.e. that a sensor changes its signal depending on the used sensor technology insignificantly before reaching the edge or only shortly after passing the edge. Since the early or delayed change has the same amount in both moving directions, the exact edge position can be determined from the calculation of the arithmetic average of the position of the signal change along the straight movement line on the way there and of the position of the signal change on the way back.

During the travel to the starting position, the sensor signal is carried out again correspondingly for a single port "Port 1" according to the steps shown in FIG. 9, and the coordinates for the upper edge 10b and the lower edge 10a are stored in further markers. Once the sensor carrier has passed both edges 10a, 10b, both markers are set and the process steps for the edge detection are completed, see block 290. Then, the described calculation of the arithmetic mean value (average) of the found position according to block 350 takes place. At first, as described before, the two arithmetic averages from the detected positions at the same edge 10a or 10b, respectively, are determined for the compensation of the hysteresis error. With this, the process steps "ATF Sense" summarized in block 120 are completed. Now, the determination of the substrate position with respect to its vertical center follows, i.e. of the center in the direction of the thickness of the substrate object 11, wherein for determination of the position with respect to the coordinate origin, the offset, i.e., the starting position of the robot grab 24 is considered, see block 130 in FIG. 6.

In a subsequent process step 80, the substrate position in the two other space coordinates is now determined. For this, two sensors 2 and 3 are used as an example for the second sensor unit. The determination of the location position in the horizontal plane is summarized in the process steps according to FIG. 7 "ATF two sensors". Here, the measurement of a curved contour 10b according to the illustration in FIG. 5d is carried out.

At the beginning of this process step, a parameter "Minimal measured length" is set equal to the value "infinite", see block 140. In block 150 follows the calculation of the position of the robot grab 24 before the process station. The subsequent process steps are carried out iteratively, i.e., they are repeated until a specified termination criterion is met, see block 220.

At first, the process steps 120 summarized under "ATF Sense" are carried out. These process steps correspond to the already described sequence according to FIG. 8. At first, the sensor carrier 1 is moved to a starting position, see block 300. After that, the movement of the sensor carrier 1 to an end position starts, see block 310. To detect the curved edge 10b bordering the surface 13 of the substrate object 11, in particular to detect the center of the contour formed by this edge, the sensor carrier 1 is moved in direction of the substrate object 11 parallel to the surface 13 of the same and across the substrate object 11. This moving direction corresponds to a movement in y-direction according to the underlying Cartesian coordinate system. This movement takes place along a straight movement line B2 (see FIG. 5d), wherein the two sensors 2 and 3 of the second sensor unit are each moved parallel to said straight movement line B2 on their own separate straight movement lines across the edge 10b.

During the movement, the process steps according to FIG. 9, i.e., the routine "ATF Sense Prog" is carried out, wherein now, due to the presence of two sensors, two ports "Port 1" and "Port 2" are monitored and are checked for a positive or negative edge change in the sensor signal. This takes place as already described in the blocks 240, 250, 260, and 270. When the first sensor 2 reaches the edge 10b, this is recognized in step 240 and the marker "Set 1 Hi Marker" is set, wherein the corresponding coordinates of this signal change are stored. When the second sensor 3 reaches the object edge 10b, this is recognized in step 260, and the second marker "Set 2 Hi Marker" is set, wherein the corresponding coordinates of this signal change are stored. In the following step 280 it is checked if the movement is completed. If this is not the case it is checked in the next step 290 if all markers are set. If this is again not the case, the inquiry of the ports starts again. Since for the determination of the center of the contour in the horizontal plane of the substrate object 11 no further edge follows, the further markers of the routine in FIG. 9 are never set. Instead, a specified end of the movement is reached, which causes the routine "ATF Sense Prog" to set all markers in step 280. This in turn is a termination criterion for the routine, see block 290, since now all markers are set. In the final result, the inquiry of the ports is therefore completed in that a movement has reached its end, i.e., the sensor carrier 1 has arrived at its end position, or in that all edges to be detected are indeed detected.

Now, the return to the starting position follows, see block 330. The previously detected edge positions are detected again during this return travel of the sensor carrier 1. When the starting position is reached, the arithmetic mean value (average) from the detected signal change positions of the same sensor is determined as described above to detect the exact position of the edge 10b along the straight movement line and thus to compensate for the hysteresis of the sensors.

After the determination of the exact edge positions, the difference of the positions of the signal change in y-direction, i.e., with respect to the straight movement line, is determined, and this difference is assigned to a parameter "measured length", see block 170. This length difference of the positions is compared in step 180 with the variable "minimum measured length" which initially was set to the value infinite. This variable is designated in step 180 as "min. length". Since the measured length difference is in any case smaller than infinite, this length difference is set as "minimum measured length", see block 200. The parameter "minimum measured length" is abbreviated in block 200 with "min. meas. length". This process step serves the purpose of a minimum search.

In a subsequent step 210, the parallel displacement of the straight movement line, i.e., an offset of the start/stop position parallel to the previous straight movement line by an amount corresponding to the length difference of the positions of the signal changes multiplied with a variable "factor" takes place. The variable "factor" is a previously specified scalar, the amount of which lies between 0 and 1 so that the parallel displacement of the straight movement line does not end outside of the substrate object 11 to be measured. Its algebraic sign indicates the direction of the parallel displacement; its amount scales the increments of the parallel displacement.

In a subsequent step 220 it is finally checked if a termination criterion is fulfilled. This is achieved when the length difference of the positions of the signal change is smaller than a specified threshold. Depending on the desired accuracy, the threshold can be between 0.01 mm and 0.5 mm, preferably 0.1 mm. If the actual length difference is still above the threshold, a repetition of the process steps 120, 170, 180, 210 takes place, i.e., the sensors 2 and 3 move again across the edge 10b of the substrate 11 in horizontal direction along the parallelly displaced straight movement line B5 (see FIG. 5d)

Moving the sensors 2 and 3 past the edge 10b delivers new signal changes at positions along the straight movement line, the difference of which signal changes is determined in y-direction and is assigned again in step 170 to the variable "measured length".

If the length difference between the positions of the signal changes of this second travel is shorter than the length difference between the positions of the signal changes of the first travel, this length difference is assigned again in step 200 to the variable "minimum measured length", abbreviated as "min. meas. length".

The parallel displacement of the straight movement line follows again, wherein the parallel displacement takes place in the same direction, but by a smaller amount which barely corresponds to the smaller spacing of the positions of the signal changes or, in case of scaling the length difference by the variable "factor" less than 1, is even smaller than the length difference.

In step 220 is now compared if the new length difference of the positions of the signal change lies below the specified threshold.

If this is still not the case, the sensor is moved again along the new straight movement line.

If the new signal changes deliver now positions which are spaced further apart from one another, then the last displacement of the straight movement line took place in the wrong direction. This is corrected by changing the algebraic sign of the variable "factor", see block 190. The last straight movement line is again displaced parallelly, see step 210, but now in the opposite direction and by an amount which is greater compared to the last parallel displacement due to the increased length difference. Since the minimal measured length remained unchanged, it arises from step 220 that the measurement of the curved edge 10b has to be repeated one more time.

If now signal changes occur at positions which, with respect to the straight movement line, have a shorter spacing compared to the penultimate movement along the edge 10b, the parameter "measured length" is smaller again than the previously measured smallest length difference. Thus, a new minimum is found. The comparison in step 180 results now in that this measured length difference is assigned to the parameter "minimum measured length". Subsequently, another parallel displacement of the original straight movement line takes place in step 210; however, in the case that the lastly measured length difference lies below the specified threshold "desired accuracy", see step 220, this results in that the process flow is terminated at this point. Then, the last straight movement line lies exactly on a diameter of the substrate object 11. Thus, the center of the contour of the curved contour 10b in x-direction is known by calculating the arithmetic average of the two last positions of the signal changes in x-direction. From the symmetry of the contour 10b to be measured and the known radius of the circular substrate 11, it is also possible to mathematically determine the spacing of the edge to the starting position of the sensor carrier 1 along the last straight movement line.

In the block designated with the reference number 90 in FIG. 6, the location position of the substrate object 11 is determined from the determined coordinates of the object edges. The dimensions of the substrate object 11, in particular the diameter and the thickness of the same are specified in step 50.

Subsequent to the calculation of the concrete location position of the substrate 11, the movement of the sensor carrier 1 back to the home position follows, see block 100. Thus, the movement is completed.

Finally, subsequent to the movement of the sensor carrier 1 or of the robot grab 24 to the home position, the storage of the determined coordinates can take place according to step 30. Thus, the process is completed with step 40.

It should be noted that the described method can be used for measuring any objects 11 in a processing system, i.e., it can be used for substrates as well as for pick-up and/or depositing means with measurable edges. The exemplary described method can be used for round and, in particular, also for angular substrate objects 11 without departing from the fundamental idea of the invention. Furthermore, it is possible to use more than two sensors thereby reducing the number of movement sequences. It is in particular to be noted that the process steps described with reference to the FIGS. 5a and 5b can be applied to the measurement of any straight contours, i.e., not only to the determination of the center of a front face 14 of an object. Thus, for example, an angular substrate object 11 with a rectangular surface 13 can have, from the sensor carrier's 1 view, a right-hand and a left-hand edge which correspond to the edges 10a, 10b shown in FIG. 5a. The moving direction along the straight line B1 would then be in x-direction. If in this manner, the depth or only the beginning of the front edge oriented towards the sensor carrier is to be determined, the moving direction B1 would correspond to the y-direction. The determination of the center of the straight contour defined by the corresponding edges can be determined as described by calculating the arithmetic average of the spacing of two opposing edges to one another. If the dimensions of the object are known, the center, or the center of gravity of the object, and hence the location position can be determined at least in such a case when the vertical and the horizontal center of the contour of the object as well as the spacing of the object to the sensor carrier or to the reference point are determined. Then it is not required to determine, in addition, the center of the object in the direction of the depth.

The invention claimed is:

1. A method for automatic measurement and for recording of location positions of objects having a curved contour within a substrate processing system by moving a sensor carrier by means of a robot grab in that sensor units of the sensor carrier are moved along straight movement lines across edges of the object, each of the sensor units outputting at least one sensor signal which changes its value upon detection of an edge, and by determining from the positions of the signal changes along the respective straight movement lines, a location position of the object, the method comprising the step of
   determining a center of the curved contour by moving at least one sensor along a first straight movement line across an edge forming the curved contour, wherein the at least one sensor outputs a first sensor signal which changes its value upon detection of the edge,
   setting up a second straight movement line by subsequently parallel displacing the first straight movement line, moving the at least one sensor along the second straight movement line across the edge wherein the at least one sensor outputs a second sensor signal which changes its value upon detection of the edge,
   calculating a position difference of the first and the second signal change,
   calculating from the position difference a new straight movement line which is parallel displaced with respect to the second straight movement line, and
   moving the at least one sensor along the new straight movement line, and
   repeating the calculation of the position difference of the last and the second last signal change, the calculation of the new straight movement line, and the moving of the at least one sensor along the new straight movement line until the position difference of the last two signal changes along the new straight movement line lies below a specified threshold, and
   calculating from the positions of these last two signal changes the center of the curved contour.

2. The method according to claim 1, further comprising the step of:
   placing the sensor assembly at first at a safety clearance before the substrate object according to specified starting coordinates in space.

3. The method according to claim 1, further comprising the step of:
   determining values corresponding to a center of a first contour of the substrate object and a center of a second contour of the substrate object as well as the spacing of the substrate object to a reference point; and
   determining from these values by addition of an offset or known dimensions of the substrate object the location position of a center point of the substrate object.

4. The method according to claim 3, further comprising the steps of:
   using as reference point the starting coordinates for determining the spacing of the substrate object to the starting coordinates by moving a sensor unit of the sensor assembly along a straight movement line toward the center of the second contour and across the edge bordering the surface of the substrate object on the front face, so as to determine the spacing from the position of the signal change initiated by this edge and from the starting coordinates.

5. The method according to claim 1, further comprising, after the determination of the location position, the step of:
   depositing the sensor assembly by the robot grab at a depositing position or before a further object, and thereafter repeating the steps of claim 1 for recording a location position of another object within the substrate-processing system.

6. The method according to claim 1, further comprising the step of:
   storing the determined location position in a storage unit of the sensor assembly, of the substrate processing system, or of a robot controller.

7. A method for automatic measurement and for recording of location positions of objects having a curved contour within a substrate processing system by moving a sensor carrier by means of a robot grab in that sensor units of the sensor carrier are moved along straight movement lines across edges of the object, each of the sensor units outputting at least one sensor signal that changes its value upon detection of an edge, and by determining from the positions of the signal changes along the respective straight movement lines, a location position of the object, wherein the sensor carrier's sensor unit used for the measurement of the curved contour has two sensors which each output a signal that changes its value upon detection of an edge, the method comprising the step of
   determining a center of the curved contour by moving the sensors along a first straight movement line across the edge forming the curved contour, and
   calculating a position difference of the two signal changes of the two sensors along the first straight movement line and
   calculating from the position difference a new straight movement line which is parallel displaced with respect to the first straight movement line, and
   moving the two sensors along the new straight movement line across the edge,
   repeating the calculation of the position difference of the signal changes of the two sensors along new first straight movement line, the calculation of the new straight movement line, and the moving along the new straight movement line, until the position difference of the two signal changes along the new straight movement line lies below a specified threshold and calculating from the positions of the two signal changes along the last calculated new straight movement line the center of the curved contour.

8. The method according to claim 7, further comprising the step of:
placing the sensor assembly at first at a safety clearance before the substrate object according to specified starting coordinates in space.

9. The method according to claim 7, further comprising the step of:
determining values corresponding to a center of a first contour of the substrate object and a center of a second contour of the substrate object as well as the spacing of the substrate object to a reference point; and
determining from these values by addition of an offset or known dimensions of the substrate object the location position of a center point of the substrate object.

10. The method according to claim 9, further comprising the steps of:
using as reference point the starting coordinates for determining the spacing of the substrate object to the starting coordinates by moving a sensor unit of the sensor assembly along a straight movement line toward the center of the second contour and across the edge bordering the surface of the substrate object on the front face, so as to determine the spacing from the position of the signal change initiated by this edge and from the starting coordinates.

11. The method according to claim 7, further comprising, after the determination of the location position, the step of:
depositing the sensor assembly by the robot grab at a depositing position or before a further object, and thereafter repeating the steps of claim 7 for recording a location position of another object within the substrate-processing system.

12. The method according to claim 7, further comprising the step of:
storing the determined location position in a storage unit of the sensor assembly, of the substrate processing system, or of a robot controller.

13. A method of automatically measuring and recording location positions of objects in a substrate processing system using a sensor assembly comprising:
a carrier plate whose shape and dimensions correspond substantially to the shape and dimensions of a substrate object to be processed,
a first sensor unit mounted on the carrier plate and arranged to detect a first edge and a second edge of the substrate object during movement of the carrier plate in a straight movement line perpendicular to an object surface, and
a second sensor unit mounted on the carrier plate and arranged to detect at least one of the edges of the substrate object during movement of the carrier plate in a straight line parallel to the object surface, each of the sensor units being adapted to output a respective sensor signal having a signal change upon reaching any of the edges,
the method comprising the steps of:
moving the sensor assembly such that the sensor units of the sensor assembly are moved along straight movement lines across the edges of the substrate object,
generating with the sensor units respective sensor signals that change value upon detection of an edge, and
determining from the positions of the signal changes along the respective straight movement lines the location position of the substrate object, and
for determination of a center of a curved contour:
moving at least one of the sensors along a first straight movement line across an edge forming the curved contour while outputting from the sensor a first sensor signal that makes a first signal change on detection of the edge across which the one sensor was moved;
subsequently moving the one sensor along a second straight movement line parallel to and offset from the first straight movement line across the edge forming the curved contour while outputting from the one sensor a second sensor signal that makes a second signal change on detection of the edge across which the one sensor was moved;
if a difference between the positions of the first and second signal changes is less than a predetermined limit, calculating from the positions of the first and second signal changes along the first and second straight movement lines the center of the curved contour; and
if a difference between the positions of the first and second signal changes is more than the predetermined limit, moving the one sensor along a further movement line parallel to but offset from the previous movement line while outputting from the one sensor a further sensor signal that makes a further signal change on detection of the edge across which the one sensor was moved and, if a difference between the positions of the further and previous second signal change is still more than the predetermined limit, repeating this step until the difference is less than the predetermined limit and then calculating from the positions of the last and the penultimate signal changes the center of the curved contour.

14. The method according to claim 13, further comprising the step of:
placing the sensor assembly at first at a safety clearance before the substrate object according to specified starting coordinates in space.

15. The method according to claim 13, further comprising the step of:
determining values corresponding to a center of a first contour of the substrate object and a center of a second contour of the substrate object as well as the spacing of the substrate object to a reference point; and
determining from these values by addition of an offset or known dimensions of the substrate object the location position of a center point of the substrate object.

16. The method according to claim 15, further comprising the steps of:
using as reference point the starting coordinates for determining the spacing of the substrate object to the starting coordinates by moving a sensor unit of the sensor assembly along a straight movement line toward the center of the second contour and across the edge bordering the surface of the substrate object on the front face, so as to determine the spacing from the position of the signal change initiated by this edge and from the starting coordinates.

17. The method according to claim 13, further comprising, after the determination of the location position, the step of:
depositing the sensor assembly by the robot grab at a depositing position or before a further object, and thereafter repeating the steps of claim 13 for recording a location position of another object within the substrate-processing system.

18. The method according to claim 13, further comprising the step of:
storing the determined location position in a storage unit of the sensor assembly, of the substrate processing system, or of a robot controller.

* * * * *